United States Patent
Ho et al.

(10) Patent No.: US 8,362,365 B2
(45) Date of Patent: Jan. 29, 2013

(54) PRINTED CIRCUIT BOARD AND METHOD OF MANUFACTURING THE SAME

(75) Inventors: Voonyee Ho, Ibaraki (JP); Katsutoshi Kamei, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 318 days.

(21) Appl. No.: 12/409,609

(22) Filed: Mar. 24, 2009

(65) Prior Publication Data
US 2009/0242259 A1    Oct. 1, 2009

Related U.S. Application Data

(60) Provisional application No. 61/043,762, filed on Apr. 10, 2008.

(30) Foreign Application Priority Data

Mar. 31, 2008    (JP) .................................. 2008-089894

(51) Int. Cl.
 H05K 1/11    (2006.01)
 H05K 1/18    (2006.01)
(52) U.S. Cl. ........................................................ 174/261
(58) Field of Classification Search ............... 174/261, 174/250, 255, 257, 258, 254, 256, 262, 260; 29/846
See application file for complete search history.

(56) References Cited

U.S. PATENT DOCUMENTS

| | | | | |
|---|---|---|---|---|
| 5,796,552 A | * | 8/1998 | Akin et al. | 360/264.2 |
| 7,019,959 B2 | * | 3/2006 | Chua | 361/329 |
| 7,092,215 B2 | * | 8/2006 | Someya et al. | 360/246 |
| 7,652,890 B2 | * | 1/2010 | Ohsawa et al. | 361/749 |
| 2002/0130739 A1 | | 9/2002 | Cotton | |
| 2004/0070884 A1 | | 4/2004 | Someya et al. | |
| 2009/0000804 A1 | | 1/2009 | Kobayashi et al. | |

FOREIGN PATENT DOCUMENTS

| | | |
|---|---|---|
| JP | 54-101360 U | 7/1979 |
| JP | 2004-133988 A | 4/2004 |
| JP | 2005-109101 A | 4/2005 |
| JP | 2006024618 A | 1/2006 |
| JP | 2007-115321 A | 5/2007 |
| JP | 2007193999 A | 8/2007 |

OTHER PUBLICATIONS

Notice of Refusal dated Oct. 30, 2012 in JP Application No. 2008-089894.

* cited by examiner

*Primary Examiner* — Javaid Nasri
(74) *Attorney, Agent, or Firm* — Panitch Schwarze Belisario & Nadel LLP

(57) ABSTRACT

Ground traces are formed to sandwich a write wiring trace. Ground walls are formed on the ground traces. A ground cover is formed so as to couple upper ends of the ground walls. Thus, the ground traces, the ground walls and the ground cover are positioned in a region above and on both sides of the write wiring trace to surround the write wiring trace.

7 Claims, 8 Drawing Sheets

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Actuators are employed in drives such as hard disk drives. Such an actuator includes an arm arranged rotatably with respect to a rotation shaft and a suspension board used for a magnetic head that is attached to the arm. The suspension board is a printed circuit board for positioning the magnetic head with a desired track of a magnetic disk.

FIG. 9 is a vertical sectional view of a conventional suspension board shown in JP 2004-133988 A, for example.

In the suspension board 910, a first insulating layer 904 is formed on a metal substrate 902. A write wiring trace W2 and a read wiring trace R2 are formed to be spaced apart from each other by a distance L1 on the first insulating layer 904.

A second insulating layer 905 is formed on the first insulating layer 904 to cover the write wiring trace W2 and the read wiring trace R2. On the second insulating layer 905, a write wiring trace W1 is formed at a position above the read wiring trace R2, and a read wiring trace R1 is formed at a position above the write wiring trace W2.

The distance between the read wiring trace R1 and the write wiring trace W2 that are positioned one above the other and the distance between the read wiring trace R2 and the write wiring trace W1 that are positioned one above the other are L2, respectively.

In the suspension board 910 having the foregoing configuration, the distances between the write wiring traces W1, W2 and the read wiring trace R1 are substantially equal to the distances between the write wiring traces W1, W2 and the read wiring trace R2, respectively. Accordingly, it is considered that the magnitude of induced electromotive forces generated in the read wiring traces R1, R2 are substantially equal when the write current flows through the write wiring traces W1, W2. This allows a crosstalk between the write wiring traces W1, W2 and the read wiring traces R1, R2 to be reduced.

Recently, reduction of transmission losses of the suspension board is desired for the purpose of low power consumption of electronic equipment.

SUMMARY OF THE INVENTION

An object of the present invention is to provide a printed circuit board in which transmission losses can be sufficiently reduced and a method of manufacturing the same.

(1) According to an aspect of the present invention, a printed circuit board includes a first insulating layer, first and second wiring traces arranged to be spaced apart from each other on the first insulating layer, a second insulating layer formed on the first insulating layer to cover both of the first and second wiring traces, and a conductor formed to cover both side surfaces and an upper surface of the second insulating layer.

In the printed circuit board, the conductor is positioned in a region above and on outer sides of the first and second wiring traces to surround the first and second wiring traces with the second insulating layer sandwiched between the conductor and the first and second wiring traces. This reduces impedance at the time of transmitting differential signals, resulting in reduction of transmission losses.

Moreover, the first and second wiring traces are shielded by the conductor positioned in the region above or on the outer sides of the first and second wiring traces. This sufficiently suppresses occurrence of a crosstalk even when another wiring trace is formed above or on the side of the first and second wiring traces.

(2) The first and second wiring traces may be arranged in a direction parallel to an upper surface of the first insulating layer. In this case, the number of steps of manufacturing the printed circuit board is reduced.

(3) The conductor may include first and second ground traces formed on the first insulating layer to sandwich the first and second wiring traces therebetween, first and second ground walls that extend from the first and second ground traces, respectively, in a direction substantially vertical to the upper surface of the first insulating layer, and a ground cover that extends substantially parallel to the upper surface of the first insulating layer to couple the first ground wall and the second ground wall.

In this case, the first and second ground traces, the first and second ground walls and the ground cover are positioned in a region above and on the outer sides of the first and second wiring traces to surround the first and second wiring traces. This allows the impedance at the time of transmitting the differential signals to be reliably reduced, resulting in reduction of the transmission losses. In addition, occurrence of the crosstalk can be reliably suppressed even when another wiring trace is formed above or on the side of the first and second wiring traces.

(4) The first and second wiring traces may be arranged in a direction vertical to an upper surface of the first insulating layer. In this case, a space for arranging the first and second wiring traces can be decreased in a direction parallel to the upper surface of the first insulating layer. This enables reduction in size of the printed circuit board.

(5) The conductor may include first and second ground traces formed on the first insulating layer to sandwich the first wiring trace therebetween, first and second ground walls that extend from the first and second ground traces, respectively, in a direction substantially vertical to the upper surface of the first insulating layer to sandwich the second wiring trace therebetween, and a ground cover that extends substantially parallel to the upper surface of the first insulating layer to couple the first ground wall and the second ground wall.

In this case, the first and second ground traces, the first and second ground walls and the ground cover are positioned in a region above and on outer sides of the first and second wiring traces to surround the first and second wiring traces. This allows the impedance at the time of transmitting the differential signals to be reliably reduced, resulting in reduction of the transmission losses. In addition, occurrence of the crosstalk can be reliably suppressed even when another wiring trace is formed above or on the side of the first and second wiring traces.

(6) The printed circuit board may further include a long-sized metal substrate, and a head provided in the metal substrate for reading and writing signals, wherein the first insulating layer may be formed on the metal substrate, and the first and second wiring traces may be electrically connected to the head.

In this case, the printed circuit board can be used as a suspension board of a drive such as a hard disk drive.

In addition, information can be written or read in/from a magnetic disk by the first and second wiring traces. In the case, reduction of the transmission losses and occurrence of the crosstalk at the time of writing or reading can be sufficiently suppressed.

(7) According to another aspect of the present invention, a method of manufacturing a printed circuit board includes the steps of arranging first and second wiring traces on a first insulating layer such that the first and second wiring traces are spaced apart from each other, forming a second insulating layer on the first insulating layer to cover both of the first and second wiring traces, and forming a conductor such that the conductor covers both side surfaces and an upper surface of the second insulating layer.

In the method of manufacturing the printed circuit board, the conductor is formed to be positioned in a region above and on outer sides of the first and second wiring traces to surround the first and second wiring traces with the second insulating layer sandwiched between the conductor and the first and second wiring traces. This reduces impedance at the time of transmitting differential signals, resulting in reduction of transmission losses.

Moreover, the first and second wiring traces are shielded by the conductor positioned in the region above or on the sides of the first and second wiring traces. This sufficiently suppresses occurrence of a crosstalk even when another wiring trace is formed above or on the side of the first and second wiring traces.

According to the present invention, the impedance at the time of transmitting differential signals is reduced, resulting in reduction of the transmission losses. Moreover, occurrence of the crosstalk can be sufficiently suppressed.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
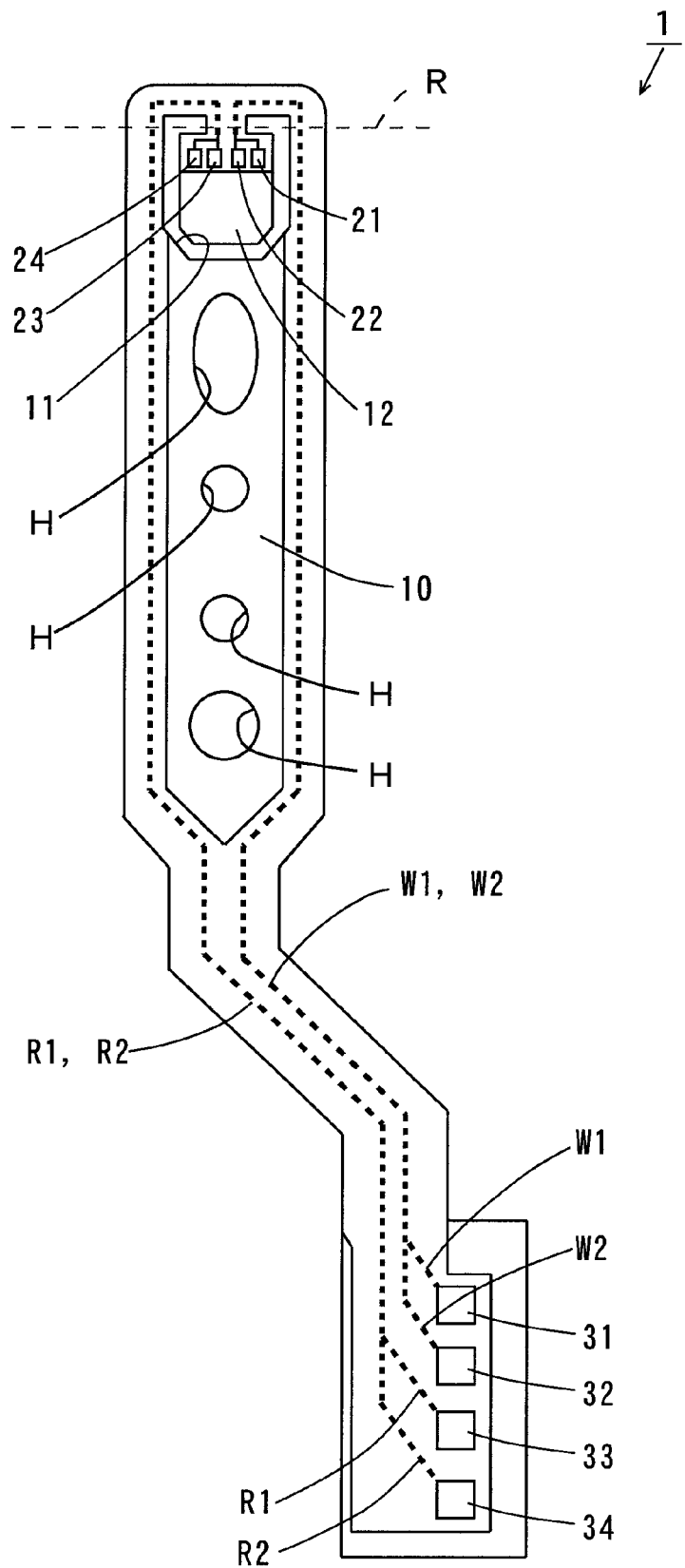
FIG. 1 is a plan view of a suspension board according to one embodiment of the present invention.

Hereinafter, a printed circuit board and a method of manufacturing the same according to one embodiment of the present invention will be described while referring to the drawings. The configuration and manufacturing method of a suspension board used in an actuator of a hard disk drive will be described as the printed circuit board according to the one embodiment of the present invention.

(1) Configuration of the Suspension Board

FIG. 1 is a top view of the suspension board according to the one embodiment of the present invention. As shown in FIG. 1, the suspension board 1 includes a suspension body 10 formed of a long-sized metal substrate. Write wiring traces W1, W2 and read wiring traces R1, R2 are formed on the suspension body 10 as indicated by the bold dotted lines.

At an end of the suspension body 10, a U-shaped opening 11 is formed, thereby providing a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected to one another by the wiring traces W1, W2, R1, R2, respectively. A plurality of holes H are formed in the suspension body 10.

In the hard disk, which is not shown, including the suspension board 1, a current flows through the pair of write wiring traces W1, W2 at the time of writing information in the magnetic disk. Moreover, the current flows through the pair of read wiring traces R1, R2 at the time of reading information from the magnetic disk.

Figure 2:
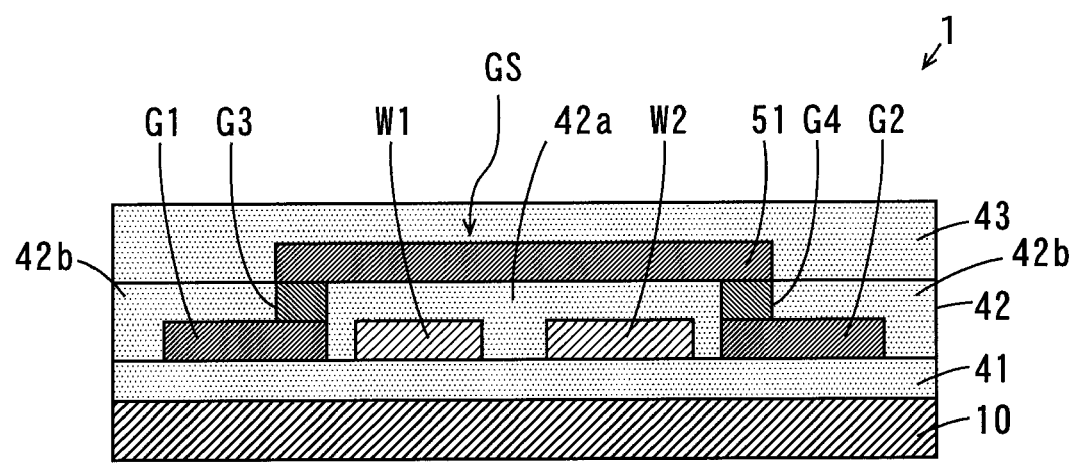
FIG. 2 is a schematic vertical sectional view of part of the suspension board of FIG. 1.

Next, detailed description will be made of the write wiring traces W1, W2 of the suspension board 1 and peripheral portions thereof. FIG. 2 is a schematic vertical sectional view of the write wiring traces W1, W2 of the suspension board 1 of FIG. 1 and the peripheral portions thereof.

As shown in FIG. 2, a first insulating layer 41 is formed on the suspension body 10. The write wiring traces W1, W2 and ground traces G1, G2 are formed on the first insulating layer 41. The write wiring traces W1, W2 are positioned in parallel to be adjacent to each other at a predetermined spacing, and the ground traces G1, G2 are arranged such that the write wiring traces W1, W2 are sandwiched therebetween.

Ground walls G3, G4 are formed on the ground traces G1, G2, respectively. The ground walls G3, G4 extend along respective inner sides of the ground traces G1, G2. An insulating layer 42a is formed inside the ground walls G3, G4 to cover the write wiring traces W1, W2. Moreover, an insulating layer 42b is formed outside the ground walls G3, G4 to cover portions of the ground traces G1, G2 on which the ground walls G3, G4 are not formed. A second insulating layer 42 is constituted by the insulating layers 42a, 42b.

A ground cover 51 is formed on the second insulating layer 42 to couple an upper end portion of the ground wall G3 and an upper end portion of the ground wall G4. A third insulating layer 43 is formed on the second insulating layer 42 to cover the ground cover 51.

A ground shield GS is constituted by the ground traces G1, G2, the ground walls G3, G4 and the ground cover 51. In the present embodiment, the ground shield GS is formed on the first insulating layer 41 to surround the write wiring traces W1, W2.

Note that dielectric constants of the first to third insulating layers 41 to 43 may be equal or different from each other. In addition, one dielectric constant of the first to third insulating layers 41 to 43 may be different from other two dielectric constants thereof. For example, the dielectric constants of the first and third insulating layers 41, 43 may be equal to each other, and the dielectric constant of the second insulating layer 42 may be smaller than the dielectric constants of the first and third insulating layers 41, 43.

(2) Manufacture of the Suspension Board

Description will be made of the method of manufacturing the suspension board 1. Here, description of respective steps of forming the tongue 12, the electrode pads 21 to 24, 31 to 34, the holes H and the read wiring traces R1, R2 of FIG. 1 is omitted.

Figure 3:
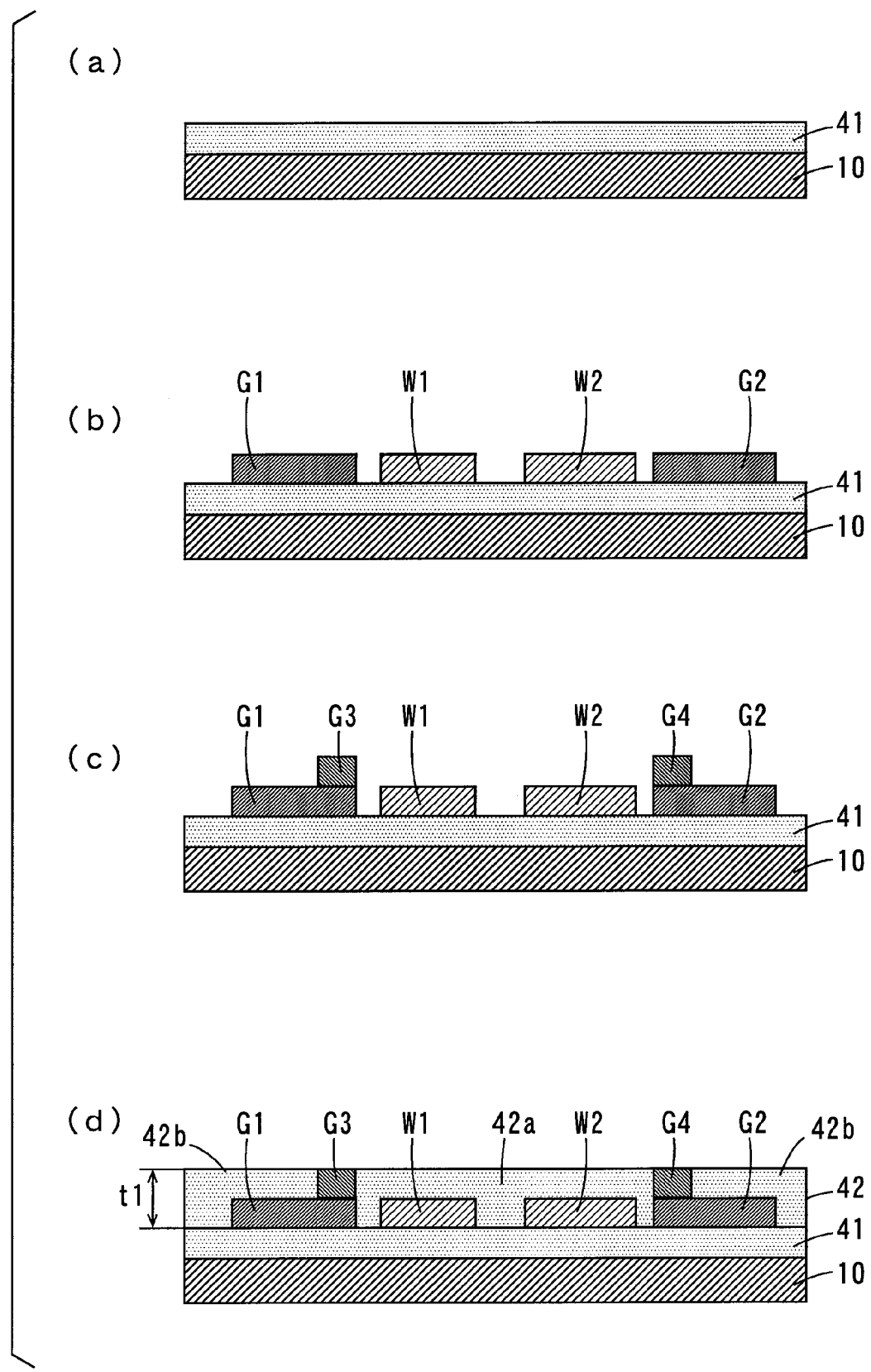
FIG. 3 is a diagram showing steps of manufacturing the suspension board according to the one embodiment of the present invention.
Figure 4:
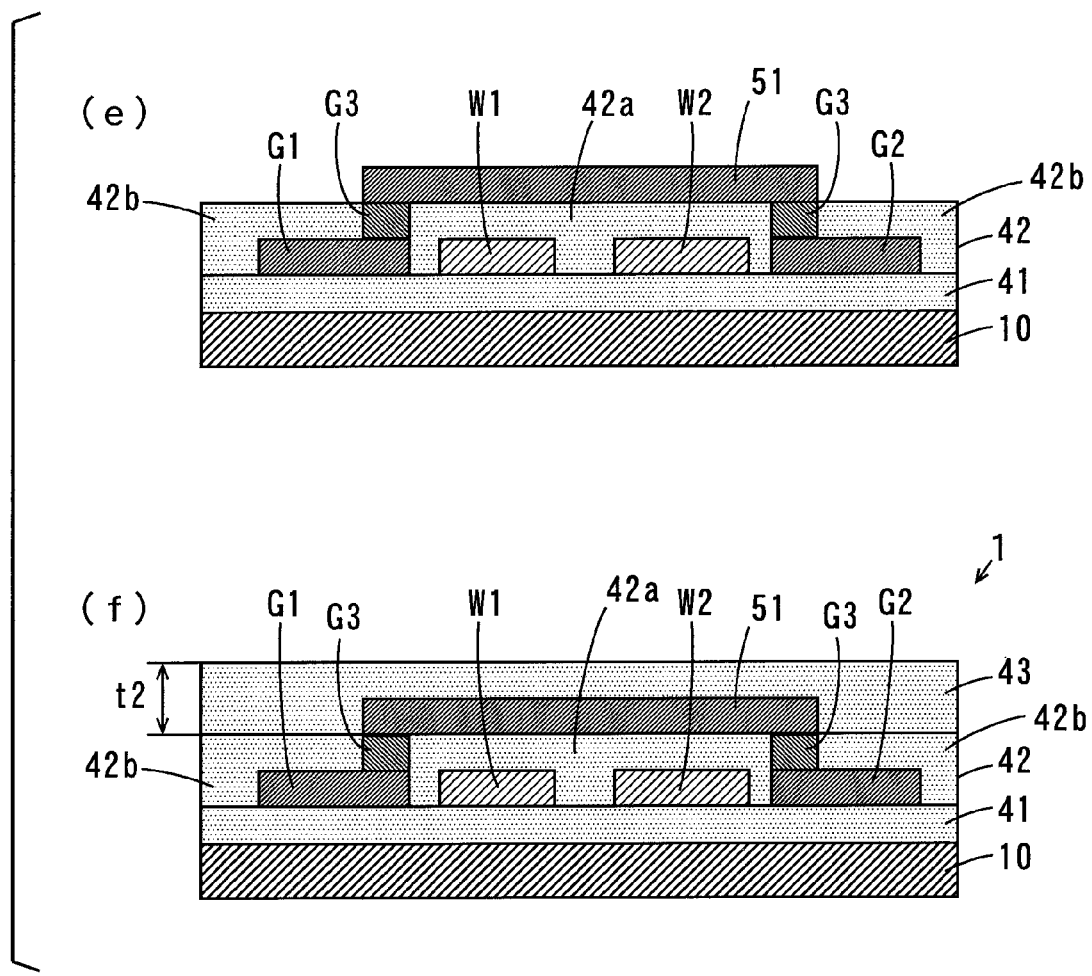
FIG. 4 is a diagram showing steps of manufacturing the suspension board according to the one embodiment of the present invention.

FIGS. 3 and 4 are vertical sectional view showing steps of manufacturing the suspension board 1 according to the one embodiment of the present invention.

First, the long-sized substrate made of stainless steel (SUS) is prepared as the suspension body 10 as shown in FIG. 3(a). Then, the first insulating layer 41 is formed on the suspension body 10.

Another material such as aluminum (Al) instead of stainless steel may be used as the suspension body 10. The thickness of the suspension body 10 is not less than 5 μm and not more than 50 μm, for example, and preferably not less than 10 μm and not more than 30 μm. The thickness of the first insulating layer 41 is not less than 3 μm and not more than 20 μm, for example, and preferably not less than 5 μm and not more than 15 μm.

The first to third insulating layers 41 to 43 are formed by adding barium titanate having a high dielectric constant to polyimide resin to be dispersed, for example. The dielectric constants of the first to third insulating layers 41 to 43 can be adjusted by adjusting an additive amount of the barium titanate to the polyimide resin.

In the present embodiment, the dielectric constant of each of the first to third insulating layers 41 to 43 is not less than 2 and not more than 12, for example, and preferably not less than 3 and not more than 8. Epoxy resin instead of polyimide resin may be used for the first to third insulating layers 41 to 43. Instead of barium titanate, another high dielectric substance such as, for example, another titanate such as lead titanate, zirconate such as barium zirconate, or lead zirconate titanate (PZT) may be used.

Then, the write wiring traces W1, W2 and the ground traces G1, G2 made of copper (Cu) are formed on the first insulating layer 41, as shown in FIG. 3(b).

The write wiring traces W1, W2 and the ground traces G1, G2 may be formed using a semi-additive method, for example, or may be formed using another method such as a subtractive method.

The write wiring traces W1, W2 and the ground traces G1, G2 can be formed using another metal such as gold (Au) and aluminum or an alloy such as a copper alloy and an aluminum alloy, not limited to copper. The ground walls G3, G4 and the ground cover 51 can be formed using the same material as that of the ground traces G1, G2.

The thickness of each of the write wiring traces W1, W2 is not less than 3 μm and not more than 16 μm, for example, and preferably not less than 6 μm and not more than 13 μm. The width of each of the write wiring traces W1, W2 is not less than 5 μm and not more than 30 μm, for example, and preferably not less than 10 μm and not more than 25 μm.

The thickness of each of the ground traces G1, G2 is not less than 3 μm and not more than 16 μm, for example, and preferably not less than 6 μm and not more than 13 μm. The width of each of the ground traces G1, G2 is not less than 5 μm and not more than 30 μm, for example, and preferably not less than 10 μm and not more than 25 μm.

The spacing between the write wiring traces W1, W2 is not less than 5 μm and not more than 100 μm, for example, and preferably not less than 10 μm and not more than 60 μm. Each of the spacing between the write wiring trace W1 and the ground trace G1 and the spacing between the write wiring trace W2 and the ground trace G2 is not less than 5 μm and not more than 100 μm, for example, and preferably not less than 10 μm and not more than 60 μm.

In the above-described configuration, thin metal films may be formed between the first insulating layer 41 and the write wiring traces W1, W2, and between the first insulating layer 41 and the ground traces G1, G2, respectively. In this case, adhesion between the first insulating layer 41 and the write wiring traces W1, W2 and between the first insulating layer 41 and the ground traces G1, G2 are improved.

Then, the ground walls G3, G4 made of copper, for example, are formed on the ground traces G1, G2, respectively, as shown in FIG. 3(c). The width of each of the ground walls G3, G4 is not less than 5 μm and not more than 25 μm, for example, and preferably not less than 10 μm and not more than 20 μm. The thickness of each of the ground walls G3, G4 is not less than 3 μm and not more than 16 μm, for example, and preferably not less than 6 μm and not more than 13 μm.

Next, the second insulating layer 42 composed of the insulating layers 42a, 42b is formed to cover the write wiring traces W1, W2 and the portions of the ground traces G1, G2 on which the ground walls G3, G4 are not formed, as shown in FIG. 3(d). The thickness t1 of the second insulating layer 42 is not less than 6 μm and not more than 32 μm, for example, and preferably not less than 12 μm and not more than 26 μm.

The ground cover 51 made of copper, for example, is subsequently formed on the second insulating layer 42 to couple the respective upper ends of the ground wall G3 and the ground wall G4 as shown in FIG. 4(e). The thickness of the ground cover 51 is not less than 3 μm and not more than 16 μm, for example, and preferably not less than 6 μm and not more than 13 μm.

The third insulating layer 43 is then formed to cover the ground cover 51 as shown in FIG. 4(f). The thickness t2 of the third insulating layer 43 is not less than 3 μm and not more than 20 μm, for example, and preferably not less than 6 μm and not more than 15 μm.

(3) Effects

In the suspension board 1 according to the present embodiment, the ground shield GS composed of the ground traces G1, G2, the ground walls G3, G4 and the ground cover 51 is formed on the first insulating layer 41 to surround the write wiring traces W1, W2. Such a configuration reduces impedance at the time of transmitting differential signals, resulting in reduction of the transmission losses.

In addition, the ground shield GS is positioned in a region above and on outer sides of the write wiring traces W1, W2 to shield the write wiring traces W1, W2. Therefore, occurrence of a crosstalk can be sufficiently suppressed even when the read wiring traces R1, R2 are formed above or on the sides of the write wiring traces W1, W2.

(4) Another Embodiment

Figure 5:
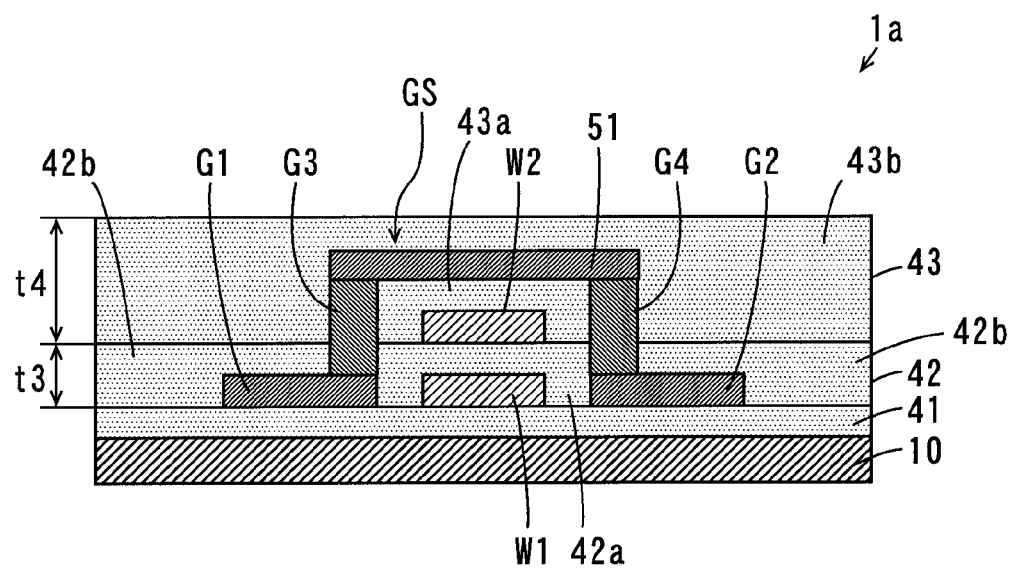
FIG. 5 is a vertical sectional view showing a suspension board according to another embodiment.

FIG. 5 is a schematic vertical sectional view showing a suspension board according to another embodiment of the present invention. The suspension board 1a of FIG. 5 is described by referring to differences from the foregoing suspension board 1.

In the suspension board 1a of FIG. 5, the write wiring trace W1 and the ground traces G1, G2 are formed on the first insulating layer 41, and the write wiring trace W2 is formed on the insulating layer 42a of the second insulating layer 42. The write wiring traces W1, W2 are arranged one above the other to be opposite to each other with the insulating layer 42a sandwiched therebetween.

In addition, the ground walls G3, G4 formed on the ground traces G1, G2 extend to positions higher than the write wiring trace W2. The ground cover 51 is formed in the third insulating layer 43 to couple the upper ends of the ground walls G3, G4. The third insulating layer 43 is divided into an insulating layer 43a formed inside the ground walls G3, G4 and the ground cover 51 and an insulating layer 43b formed to cover the ground walls G3, G4 and the ground cover 51.

In the suspension board 1a of FIG. 5, the thickness of each of the write wiring traces W1, W2 is not less than 3 μm and not more than 16 μm, for example, and preferably not less than 6 μm and not more than 13 μm. The width of each of the write wiring traces W1, W2 is not less than 5 μm and not more than 30 μm, for example, and preferably not less than 10 μm and not more than 25 μm.

The thickness of each of the ground traces G1, G2 is not less than 3 μm and not more than 16 μm, for example, and preferably not less than 6 μm and not more than 13 μm. The width of each of the ground traces G1, G2 is not less than 5 μm and not more than 30 μm, for example, and preferably not less than 10 μm and not more than 25 μm. Moreover, each of the spacing between the write wiring trace W1 and the ground trace G1 and the spacing between the write wiring trace W1 and the ground trace G2 is not less than 5 μm and not more than 100 μm, for example, and preferably not less than 10 μm and not more than 60 μm.

The width of each of the ground walls G3, G4 is not less than 5 μm and not more than 25 μm, for example, and preferably not less than 10 μm and not more than 20 μm. The thickness (height) of each of the ground walls G3, G4 is not less than 8 μm and not more than 100 μm, for example, and preferably not less than 10 μm and not more than 50 μm.

The thickness t3 of the second insulating layer 42 is not less than 6 μm and not more than 32 μm, for example, and preferably not less than 12 μm and not more than 26 μm. The thickness t4 of the third insulating layer 43 is not less than 7 μm and not more than 100 μm, for example, and preferably not less than 10 μm and not more than 70 μm. The thickness of the ground cover 51 is not less than 3 μm and not more than 16 μm, for example, and preferably not less than 6 μm and not more than 13 μm. Moreover, the distance between the write wiring trace W2 and the ground cover 51 is not less than 1 μm and not more than 10 μm, for example, and preferably not less than 3 μm and not more than 7 μm.

Also in the suspension board 1a, the ground shield GS composed of the ground traces G1, G2, the ground walls G3, G4 and the ground cover 51 is formed to surround the write wiring traces W1, W2. Such a configuration reduces the impedance at the time of transmitting the differential signals, resulting in reduction of the transmission losses.

In addition, the ground shield GS is positioned in a region above and on outer sides of the write wiring traces W1, W2 to shield the write wiring traces W1, W2. Therefore, occurrence of the crosstalk can be sufficiently suppressed even when the read wiring traces are formed above or on the sides of the write wiring traces W1, W2.

(5) INVENTIVE EXAMPLES AND COMPARATIVE EXAMPLE

(5-1) Inventive Example 1

The suspension board 1 shown in FIG. 2 was manufactured as an inventive example 1. The thickness of each of the write wiring traces W1, W2 was 10 μm, the width of each of the write wiring traces W1, W2 was 50 μm, and the spacing between the write wiring traces W1, W2 was 10 μm. Each of the spacing between the write wiring trace W1 and the ground trace G1 and the spacing between the write wiring trace W2 and the ground trace G2 was 10 μm.

The thickness of each of the ground traces G1, G2 was 10 μm, and the width of each of the ground traces G1, G2 was 50 μm. The width of each of the ground walls G3, G4 was 20 μm, the thickness (height) of each of the ground walls G3, G4 was 10 μm, and the thickness of the ground cover 51 was 10 μm.

(5-2) Inventive Example 2

The suspension board 1a shown in FIG. 5 was manufactured as an inventive example 2. Note that the thickness of the write wiring trace W1 was 7 μm, the thickness of the write wiring trace W2 was 4 μm, the width of each of the write wiring traces W1, W2 was 33 μm, and the distance between the write wiring traces W1, W2 was 4 μm.

Each of the spacing between the write wiring trace W1 and the ground trace G1 and the spacing between the write wiring trace W1 and the ground trace G2 was 15 μm, the thickness of each of the ground traces G1, G2 was 4 μm, and the width of each of the ground traces G1, G2 was 50 μm. In addition, the width of each of the ground walls G3, G4 was 20 μm, the thickness (height) of each of the ground walls G3, G4 was 16 μm, and the thickness of the ground cover 51 was 5 μm.

(5-3) Comparative Example

Figure 6:
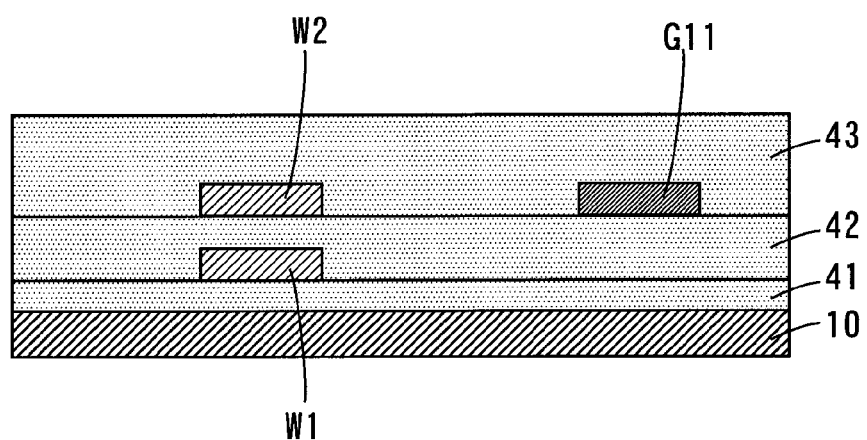
FIG. 6 is a schematic sectional view of a suspension board of a comparative example.

FIG. 6 is a schematic sectional view of a suspension board of a comparative example. The suspension board 1b of FIG. 6 is different from the suspension board 1a of the inventive example 2 in the following points.

In the suspension board 1b, the ground shield GS composed of the ground traces G1, G2, the ground walls G3, G4 and the ground cover 51 was not formed. In addition, a ground trace G11 is formed on the second insulating layer 42 to be spaced apart from the write wiring trace W2.

Note that the thickness of the write wiring trace W1 was 4 μm, the thickness of the write wiring trace W2 was 7 μm, the width of each of the write wiring traces W1, W2 was 50 μm, and the distance between the write wiring traces W1, W2 was 5 μm. The thickness of the ground trace G11 was 7 μm, and the width thereof was 50 μm. The distance between the write wiring trace W1 and the ground trace G11 was 200 μm.

(5-4) Evaluation

Losses in a differential mode input and a differential mode output (Sdd21) and losses in the differential mode input and a common mode output (Scd21) were examined in the suspension board 1, 1a, 1b of the inventive examples 1, 2 and the comparative example.

Figure 7:
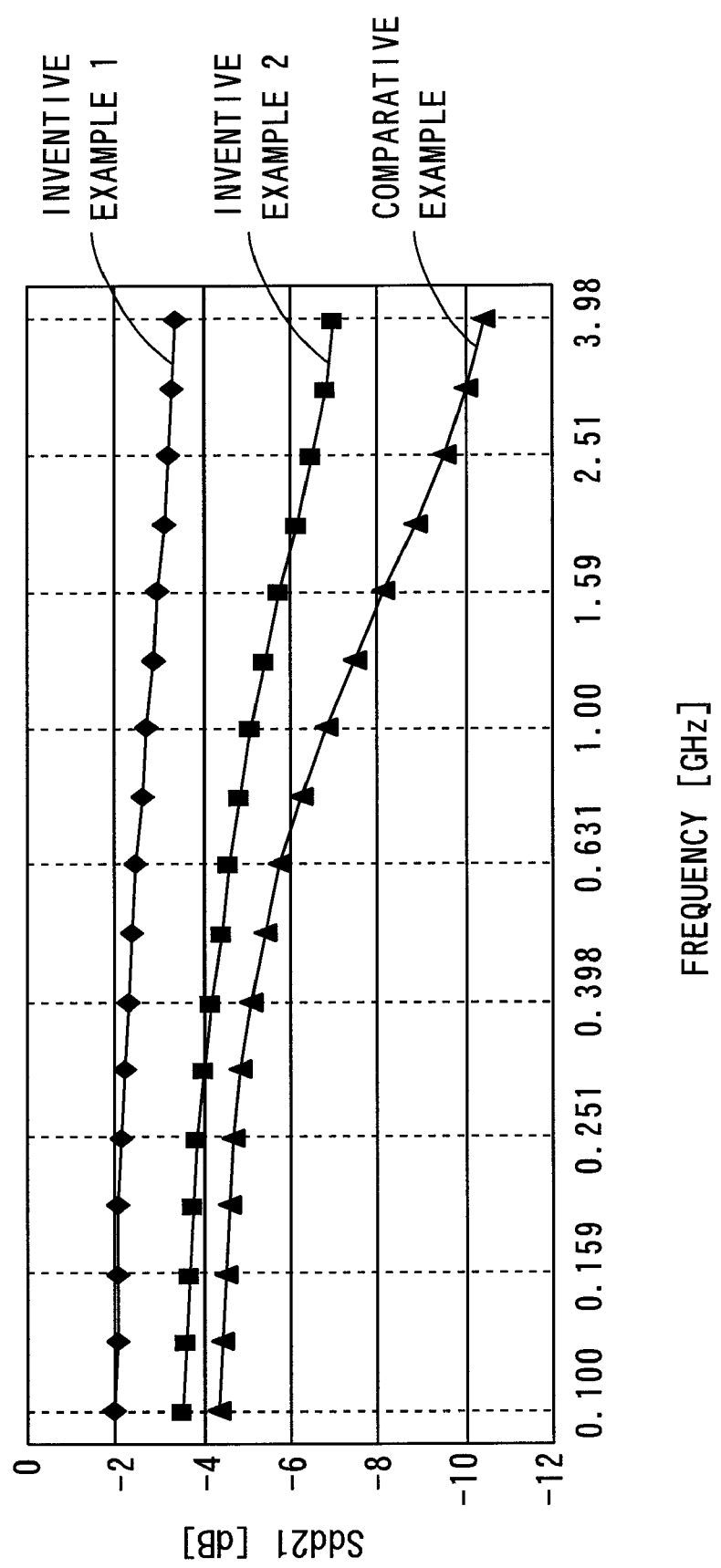
FIG. 7 is a diagram showing results of calculation of losses in a differential mode input and a differential mode output.
Figure 8:
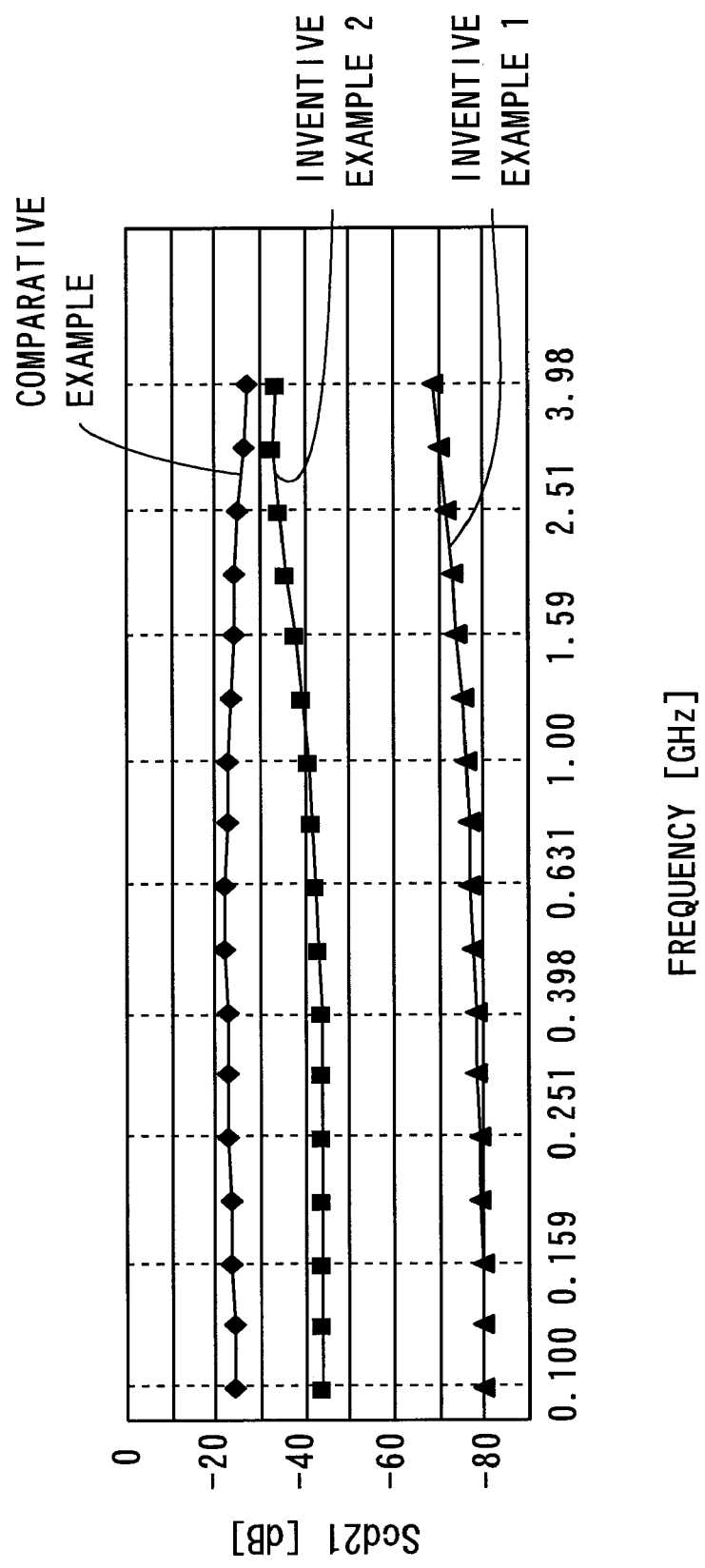
FIG. 8 is a diagram showing results of calculation of losses in the differential mode input and a common mode output.
Figure 9:
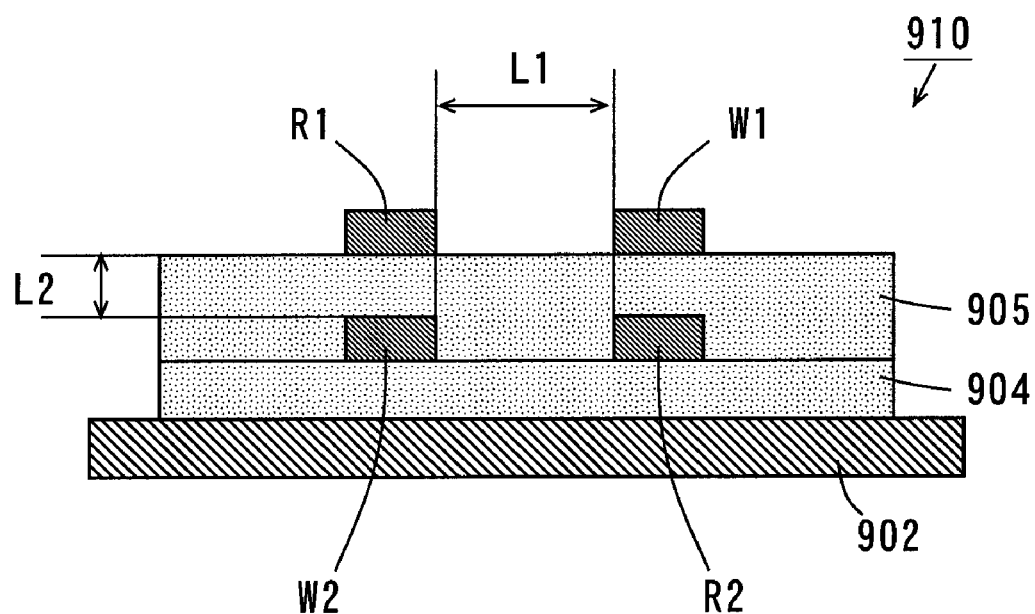
FIG. 9 is a vertical sectional view showing an example of a conventional suspension board.

FIG. 7 is a diagram showing results of calculation of the losses in the differential mode input and the differential mode output. FIG. 8 is a diagram showing results of calculation of the losses in the differential mode input and the common mode output. In FIGS. 7 and 8, the ordinate indicates a gain, and the abscissa indicates a frequency of a signal. In this case, a negative gain represents the loss.

As shown in FIG. 7, the losses in the differential mode input and the differential mode output in the suspension boards 1, 1a of the inventive examples 1, 2 were smaller than that in the suspension board 1b of the comparative example. This shows that the ground shield GS is formed to surround the write wiring traces W1, W2, so that the impedance at the time of transmitting the differential signals is reduced, resulting in reduction of the transmission losses.

Moreover, as shown in FIG. 8, the losses in the differential mode input and the common mode output (conversion from the differential mode to the common mode) in the suspension boards 1, 1a of the inventive examples 1, 2 were larger than that in the suspension board 1b of the comparative example.

This shows that the conversion from the differential mode to the common mode is unlikely to be performed in the suspension boards 1, 1a of the inventive examples 1, 2, as compared with the suspension board 1b of the comparative example.

Thus, it was found that the ground shield GS was formed to surround the write wiring traces W1, W2, so that occurrence of an EMI (electromagnetic interference) and the transmission losses of the differential signals can be suppressed.

(6) Still Another Embodiment

While the ground shield GS is provided to surround the write wiring traces W1, W2 in the foregoing embodiments, the ground shield GS may be similarly provided to surround the read wiring traces R1, R2.

In addition, the suspension body 10 may not be provided in the suspension boards 1, 1a of the foregoing embodiments.

(7) Correspondences between Elements in the Claims and Parts in Emdodiments

In the following paragraph, non-limiting examples of correspondences between various elements recited in the claims below and those described above with respect to various preferred embodiments of the present invention are explained.

In the foregoing embodiments, the write wiring trace W1 is an example of a first wiring trace, the write wiring trace W2 is an example of a second wiring trace, the insulating layers 42a, 43a are examples of a second insulating layer, and the ground shield GS is an example of a conductor. The ground traces G1, G2 are examples of first and second ground traces, and the ground walls G3, G4 are examples of first and second ground walls. The suspension body 10 is an example of a metal substrate, and the tongue 12 is an example of a head.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board comprising:
    a metal substrate;
    a first insulating layer formed on an upper surface of said metal substrate;
    first and second wiring traces arranged to be spaced apart from each other on an upper surface of said first insulating layer, wherein said first and second wiring traces are arranged in a direction parallel to the upper surface of said first insulating layer, and said first and second wiring traces constitute a signal line pair that transmits a differential signal;
    a second insulating layer formed on the upper surface of said first insulating layer to cover both of said first and second wiring traces; and
    a conductor formed to cover both side surfaces and an upper surface of said second insulating layer, said conductor including:
        first and second ground traces formed on the upper surface of said first insulating layer to sandwich said first and second wiring traces therebetween,
        first and second ground walls that extend from said first and second ground traces, respectively, in a direction substantially vertical to the upper surface of said first insulating layer, and
        a ground cover that extends substantially parallel to the upper surface of said first insulating layer to couple said first ground wall and said second ground wall, wherein
    one side surface of said first ground trace and one side surface of said first wiring trace are opposite to each other to sandwich part of said second insulating layer therebetween, one side surface of said second ground trace and one side surface of said second wiring trace are opposite to each other to sandwich part of said second insulating layer therebetween, and another side surface of said first wiring trace and another side surface of said second wiring trace are opposite to each other to sandwich part of said second insulating layer therebetween.

2. The printed circuit board according to claim 1, further comprising:
    a head provided on said metal substrate for reading and writing signals, wherein
    said first and second wiring traces are electrically connected to said head.

3. A printed circuit board comprising:
    a metal substrate;
    a first insulating layer formed on an upper surface of said metal substrate;
    a first wiring trace formed on the upper surface of said first insulating layer;
    a second insulating layer formed on the upper surface of said first insulating layer to cover said first wiring trace;
    a second wiring trace formed on an upper surface of the second insulating layer so as to be located above said first wiring trace;
    a third insulating layer formed on the upper surface of the second insulating layer to cover the second wiring trace; and
    a conductor formed to surround the first and second wiring traces, wherein
    said first and second wiring traces constitutes a signal line pair that transmits a differential signal,
    a width of said first wiring trace is equal to a width of said wiring trace,
    said conductor includes:
        a first side portion formed so as to extend from the upper surface of the first insulating layer to an upper surface of the third insulating layer on one side of each of the first and second wiring traces and to be distant from one side surface of the first wiring trace and from one side surface of the second wiring trace,
        a second side portion formed so as to extend from the upper surface of the first insulating layer to the upper surface of the third insulating layer on another side of each of the first and second wiring traces and to be distant from another side surface of the first wiring trace and from another side surface of the second wiring trace,
        an upper portion formed on the upper surface of the third insulating layer so as to couple an upper end of the first side portion and an upper end of the second side portion, and
        a distance between said first wiring trace and said first side portion, a distance between said first wiring trace and said second side portion, a distance between said second wiring trace and said first side portion, and a distance between said second wiring trace and said second side portion are equal to one another.

4. The printed circuit board according to claim 3, further comprising:
a head provided on said metal substrate for reading and writing signals, wherein
said first and second wiring traces are electrically connected to said head.

5. A printed circuit board comprising:
a first insulating layer;
first and second wiring traces arranged to be spaced apart from each other on said first insulating layer, wherein said first and second wiring traces are arranged in a direction vertical to an upper surface of said first insulating layer;
a second insulating layer formed on said first insulating layer to cover both of said first and second wiring traces; and
a conductor formed to cover both side surfaces and an upper surface of said second insulating layer, wherein said conductor includes:
first and second ground traces formed on said first insulating layer to sandwich the first wiring trace therebetween,
first and second ground walls that extend from said first and second ground traces, respectively, in a direction substantially vertical to the upper surface of said first insulating layer to sandwich said second wiring trace therebetween, and
a ground cover that extends substantially parallel to the upper surface of said first insulating layer to couple said first ground wall and said second ground wall.

6. A method of manufacturing a printed circuit board, comprising the steps of:
forming a first insulating layer on an upper surface of a metal substrate;
arranging first and second wiring traces on the upper surface of said first insulating layer such that the first and second wiring traces are spaced apart from each other, wherein said first and second wiring traces are arranged in a direction parallel to the upper surface of said first insulating layer;
forming a second insulating layer on the upper surface of said first insulating layer to cover both of said first and second wiring traces; and
forming a conductor such that the conductor covers both side surfaces and an upper surface of said second insulating layer, wherein
said first and second wiring traces constitute a signal line pair that transmits a differential signal,
said conductor includes:
first and second ground traces formed on the upper surface of said first insulating layer to sandwich said first and second wiring traces therebetween,
first and second ground walls that extend from said first and second ground traces, respectively, in a direction substantially vertical to the upper surface of said first insulating layer,
a ground cover that extends substantially parallel to the upper surface of said first insulating layer to couple said first ground wall and said second ground wall, and
one side surface of said first ground trace and one side surface of said first wiring trace are opposite to each other to sandwich part of said second insulating layer therebetween, one side surface of said second ground trace and one side surface of said second wiring trace are opposite to each other to sandwich part of said second insulating layer therebetween, and another side surface of said first wiring trace and another side surface of said second wiring trace are opposite to each other to sandwich part of said second insulating layer therebetween.

7. A method of manufacturing a printed circuit board, comprising the steps of:
forming a first insulating layer on an upper surface of a metal substrate;
forming a first wiring trace on the upper surface of the first insulating layer;
forming a second insulating layer on the upper surface of said first insulating layer to cover said first wiring trace;
forming a second wiring trace on an upper surface of the second insulating layer so as to be located above the first wiring trace;
forming a third insulating layer on the upper surface of the second insulating layer to cover said second wiring trace; and
forming a conductor to surround the first and second wiring traces, wherein
said first and second wiring traces constitute a signal line pair that transmits a differential signal,
a width of said first wiring trace is equal to a width of said second wiring trace,
the step of forming the conductor includes the steps of:
forming a first side portion so as to extend from the upper surface of the first insulating layer to an upper surface of the third insulating layer on one side of each of the first and second wiring traces and to be distant from one side surface of the first wiring trace and from one side surface of the second wiring trace,
forming a second side portion so as to extend from the upper surface of the first insulating layer to the upper surface of the third insulating layer on another side of each of the first and second wiring traces and to be distant from another side surface of the first wiring trace and from another side surface of the second wiring trace,
forming an upper portion on the upper surface of the third insulating layer so as to couple an upper end of the first side portion and an upper end of the second side portion, and
a distance between said first wiring trace and said first side portion, a distance between said first wiring trace and said second side portion, a distance between said second wiring trace and said first side portion, and a distance between said second wiring trace and said second side portion are equal to one another.

* * * * *